Jan. 12, 1971 B. BAUMANIS 3,555,494

PRINTED CIRCUIT BOARD CONNECTOR

Filed March 25, 1968

Inventor
Bruno Baumanis
By: Olson, Trexler, Wolters & Bushnell attys.

United States Patent Office 3,555,494

Patented Jan. 12, 1971

3,555,494

PRINTED CIRCUIT BOARD CONNECTOR

Bruno Baumanis, River Forest, Ill., assignor to Molex Products Company, Downers Grove, Ill., a corporation of Illinois Filed Mar. 25, 1968, Ser. No. 715,710
Int. Cl. H01r 13/42
U.S. Cl. 339—176 5 Claims

ABSTRACT OF THE DISCLOSURE

A printed circuit board connector including a housing having therein and extending partially therethrough, a first elongated aperture for receiving a printed circuit board, and a plurality of separate, second apertures which communicate with the first aperture. A plurality of terminal members each including a reversely bent, resilient, slotted contact strip, is received in predetermined ones of the second apertures in snap-in fashion; the resilient contact strip extending into the first aperture to contact the printed conductors of the printed circuit board upon the insertion of the latter into the first aperture. The terminal member further includes a pair of side portions upon which the former rests, partially on ledges extending into the second apertures as well as on the floor of the housing. The side portions also protect the free end of the contact strip from becoming entangled in foreign objects.

BACKGROUND OF THE INVENTION

This invention relates generally to connectors for printed circuit boards, and more particularly to edge type printed circuit board connectors.

Many varieties of edge type printed circuit board connectors are presently in use. A great many of the factory assembled kind include a housing portion in which a plurality of permanently imbedded connector terminals is located. These terminals are not removable; thus if only certain ones thereof are required for a specific purpose, the others remain idle within the housing. Because the terminals are normally constructed of a rather expensive metal, and because it requires additional labor to implant the extra terminals in the housing, unnecessary cost is incurred in many cases.

One type of terminal commonly used in the above-mentioned printed circuit board connectors comprises twin contacts interconnected at one end thereof, but separated at the other end thereof, much like a tuning fork. These contacts provide an initially acceptable interconnection with the printed circuit board, but later, because of the decrease in resiliency of the terminals, or because of the interposition of dirt or corrosion, there is a good chance that an insufficient connection will be made therebetween. Furthermore, these and other types of terminals presently in use often damage the printed circuit board after a number of insertions and extractions of the latter into the former.

SUMMARY OF THE INVENTION

Accordingly, it is a general object of this invention to provide a new and improved edge type printed circuit board connector.

It is a more specific object of this invention to provide an improved printed circuit board connector which overcomes the aforementioned disadvantages.

It is still another object of this invention to provide an edge type printed circuit board connector which includes removable, replaceable snap-in terminals.

It is yet another object of this invention to provide an edge type printed circuit board connector of the last mentioned kind wherein the terminals, due to the structural design thereof, retain their resiliency after many insertions and extractions of a printed circuit board thereinto.

DESCRIPTION OF THE DRAWINGS

A better understanding of the present invention and its organization and construction may be had by referring to the description below in conjunction with the accompanying drawings wherein.

DETAILED DESCRIPTION

Figures 1, 2, 3, 4, 5, 6, 7:
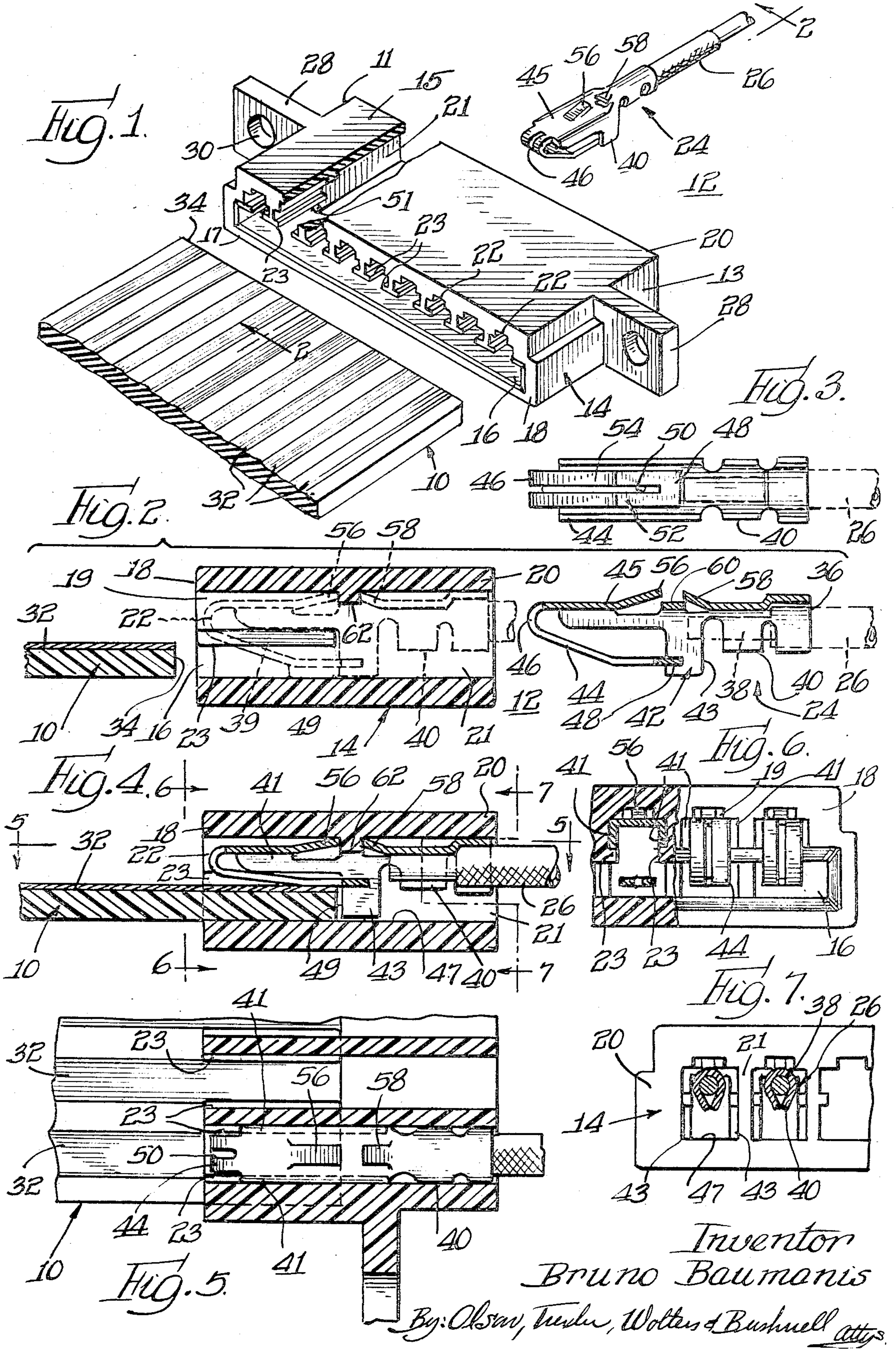
FIG. 1 is an exploded perspective view of a printed circuit board and printed circuit board connector according to the invention.
FIG. 2 is a cross-sectional view of the printed circuit board and printed circuit board connector of FIG. 1 taken along the line 2—2 thereof.
FIG. 3 is a bottom plan view of the snap-in terminal portion of the printed circuit board connector of FIG. 2.
FIG. 4 is a cross-sectional view of a printed circuit board and printed circuit board connector according to the invention shown in an interconnected position.
FIG. 5 is a cross-sectional view of the interconnected printed circuit board and connector of FIG. 3 taken along the line 5—5 thereof.
FIG. 6 is a cross-sectional view of the interconnected printed circuit board and connector of FIG. 3 taken along the line 6—6 thereof.
FIG. 7 is a cross-sectional view of the interconnected printed circuit board and connector of FIG. 3 taken along the lines 7—7 thereof.

Referring now to the drawings more in detail, a printed circuit board 10 and printed circuit board connector 12 according to the invention are shown in FIG. 1. The printed circuit board connector 12 includes a one-piece molded housing 14 having a front and a rear wall 18 and 20, respectively, a pair of side walls 11 and 13, respectively, and a top and base portion 15 and 17, respectively. An elongated aperture 16 extends from the front wall 18 toward the rear wall 20 thereof to a point approximately half the distance therebetween. Located above elongated aperture 16 so as to communicate therewith, is a plurality of T-shaped openings 22, extending through housing portion 14 from front wall 18 to rear wall 20. On either side of each of the T-shaped openings 22 extending thereinto, is a ledge portion 23 which runs approximately half the distance from wall 18 of the housing toward rear wall 20 thereof. Interior side walls 21, as shown in the sectioned portion of housing 14 in FIG. 1, serve to separate openings 22 from each other and, as will be noted, extend from top portion 15 to base portion 17 from approximately the center of the housing 14 to the rear wall 20 and extend only approximately half the distance from top portion 15 to base portion 17 toward front wall 18, to allow for the insertion of printed circuit board 10 into elongated aperture 16.

A plurality of snap-in, one-piece, stamped, spring metal terminal members 24, only one of which is shown, is received in the T-shaped openings 22 from the rear of housing portion 14. Each of the terminals has a lead 26 connected thereto which serves to connect the terminal electrically to external circuitry or the like (not shown). The terminals, which are preferably made in interconnected groups, may be prewired so that, subsequent to the insertion thereof into respective openings 22 in housing 14, no wiring of the terminals is necessary.

A pair of tabs 28, each including therein an aperture 30, may be provided on housing 14, as shown in FIG. 1, so that the connector 12 may be mounted by means of screws or rivets to a support surface.

Printed circuit board 10, as can be seen in FIG. 1, includes thereon a plurality of printed copper strips such as 32, provided to mate with the terminals 24 upon the insertion of the edge 34 of board 10 in elongated aperture 16 in housing portion 14.

Looking at FIGS. 2 to 4 of the drawings, a more detailed explanation of the printed circuit board connector 12 will now be given.

As can be seen in FIG. 2, the terminal member 24 includes at the trailing end 36 thereof a crimp-type connector portion 40 for attaching, both mechanically and electrically, the terminal member onto the conductor portion 38 of lead 26. Integrally formed with the crimped portion 40 are a pair of L-shaped side portions 42 and a reversely bent, resilient, finger-like contact portion 44 located between the L-shaped side portions. The longer legs 41 of L-shaped side portions 42 extend along a portion 45 of the terminal prior to the reversely bent section 46 thereof, and the shorter legs 43 extend outwardly on opposite sides thereof, so as to surround the free end 48 of the reversely bent contact portion 44. This is done to prevent foreign objects, such as wire, etc., from lodging behind or becoming entangled with the free end 48 of the contact portion 44 prior to insertion of the terminal member into a corresponding T-shaped opening in housing 14, as well as after the insertion thereof in the T-shaped opening.

As can be seen in FIG. 3 of the drawings, reversely bent contact portion 44 includes therein a slot 50, extending from the reversely bent section 46, just beyond the end of leg 41 of the L-shaped side portions 42, toward the free end 48 thereof. The slot 50 provides interconnected twin contacts 52 and 54 to insure good electrical connection with a corresponding copper strip 32 on the printed circuit board 10. The slot, as will be noted, does not separate the twin contacts 52 and 54 at the free ends thereof. Thus, the resiliency of the finger portion of the instant invention is not reduced after several insertions and extractions of the printed circuit board. The provision of the slot 50 also allows for individual movement of the contacts 52 and 54, and this insures a good connection between the copper strips of the printed circuit board and the terminal member even though one of these contacts might be held away from a copper strip by dirt or corrosion.

The terminal member 24 is shown in dotted lines in FIG. 2 as it appears after being inserted into the housing portion 14, prior to the insertion of mating printed circuit board 10. Included on terminal member 24, along portion 45 thereof, are a pair of uplifted barbed tab members 56 and 58, respectively. The tab members are in opposing relation to each other, thus to provide therebetween an opening 60. The housing portion 14 into which terminals 24 are inserted includes in each of the T-shaped openings therein a tab portion 62 extending downwardly into the opening approximately at the center thereof. The opposing tab members 56 and 58, being resilient, are secured on either side of tab portion 62 upon the insertion of terminal member 24 into a respective T-shaped opening 22. A space 19 is provided for the insertion of a small tool (not shown) to release tab member 58 from tab portion 62 in the event the terminal member 24 must be withdrawn from the opening 22.

As will be noted in FIG. 2, upon the insertion of terminal members 24 in a respective opening 22, the longer legs 41 of the L-shaped side portions 42 rest on respective ledge portions 23 extending into opening 22 from either side thereof, and resilient mating contact portion 44 extends downwardly therebetween, as shown in FIG. 2, into opening 16 of the housing portion. Thus, as shown in FIG. 4, when the printed circuit board 10 is inserted from the opposite end of the housing portion, the contact portion 44 engages a respective copper strip conductor 32 on the board. The contact portion 44 is bent upwardly upon the insertion of the board, but applies sufficient pressure against the copper conductor to provide good mechanical and electrical connections therebetween without damaging the copper strip. A wiping connection is effected upon the insertion of the board to further insure a good electrical connection. The shorter legs 43 of the L-shaped side portions 42 extend downwardly into opening 16 so as to rest on the floor 47 of the housing, and the leading edge 49 of legs 43 assumes a position parallel with the leading end 51 of the interior wall 21, best seen in FIG. 1, within housing 14.

FIGS. 5 and 6 of the drawings show more clearly the manner in which legs 41 of the L-shaped side portions of terminal member 24 rest on opposing ledge portions 23 to aid in the support of the terminal member. In addition, there is shown clearly how finger portion 44 extends between the legs 41 and into elongated opening 16.

FIG. 7 of the drawings illustrates the manner in which shorter legs 43 rest on the floor 47 of the housing 14. Conductor 38 of lead 26 can easily be seen attached by means of crimping portion 40 to the terminal member 24. It should be understood that while a crimping portion 40 is preferred because of the ease of attachment of the lead wires to the terminals, both in the pre-wiring thereof and after the terminal member is in place, other types of connections may be made to terminal member 24. FIG. 7 also shows that from the rear wall 20 of the housing 14, each of the terminal members and respective leads 26 are provided with a separate, individual opening into which the terminal is inserted. This provides ease in securing the terminal members in the openings.

Thus, the invention provides a new and improved, easy to use, reliable printed circuit board connector wherein prewired terminal members may be placed in selected locations in the connector housing, according to the particular requirement of the connector, thereby avoiding having unused terminal members therein. Furthermore, each of the terminal members are constructed so that they may be used many times over without losing resiliency and contact pressure.

What is claimed is:

1. A printed circuit board connector comprising: a housing portion having a first aperture means therein for receiving a printed circuit board having a plurality of printed conductors thereon, and a plurality of second aligned aperture means extending therethrough, each of said plurality of second aperture means communicating with said first aperture means, and a plurality of terminal members received in certain predetermined ones of said second aperture means, each of said terminal members including a leading and trailing end portion, said leading end portion including resilient contact means for electrically connecting to said printed circuit board and said trailing end including means for connecting said terminal member to external circuitry, said terminal member further including snap-in means which, upon the insertion of the leading end portion of said terminal member into one of said second aperture means, secures said terminal member in said last mentioned aperture means, said leading end portion including a body extending forward from said trailing end portion, a finger integral with the front end of said body and extending rearwardly therefrom and diagonally away from said body for a predetermined distance and thereafter extending substantally parallel to said body, said finger terminating a free rear end and further including projections on the oposite sides of said body extending part and overlapping the free rear end of the finger.

2. A printed circuit board connector comprising: a housing portion having a first aperture means therein for receiving a printed circuit board having a plurality of printed conductors thereon, and a plurality of second aligned aperture means extending therethrough, each of said plurality of second aperture means communicating with said first aperture means, and a plurality of terminal members received in certain predetermined ones of said second aperture means, each of said terminal members including a leading and trailing end portion, said leading end portion including resilient contact means for electrically connecting to said printed circuit board and said trailing end including means for connecting said terminal member to external circuitry, said terminal member further including snap-in means which, upon the insertion of the leading end portion of said terminal member into one of said second aperture means, secures said terminal member in said last mentioned aperture means, each of said terminal members including an outwardly extending portion on either side of said contact means and wherein each of said second aperture means includes ledge means, whereby upon the insertion of said terminal member into said second aperture means, said side portions rest on said ledge means to aid in the support of said terminal member within said second aperture means, said contact means including a metallic strip portion extending outwardly from the leading end of said terminal member and being reversely bent to extend toward the trailing end of said terminal member between said side portions, said contact means including therein slot means extending from the leading end of said terminal member along said metallic strip toward the free end thereof, and wherein the side portions of said terminal member extend outwardly on opposite sides of the free end of said reversely bent metallic strip, thereby to prevent foreign objects from becoming entangled with said free end, said housing means including a base portion, the inner surface of which comprises the floor of said housing means, and wherein said side portions are each L-shaped with the longer leg of the L extending from said trailing end connecting means toward said leading end of said terminal member, and the shorter leg extending outwardly so as to rest on the floor of said housing to aid in the support of said terminal member in said second aperture means as well as protect the free end of said metallic contact strip.

3. A connector for use with a printed circuit board having a plurality of conductors thereon, said connector comprising: a housing having therein and extending partially therethrough, a first aperture for receiving said printed circuit board, and a plurality of separate second apertures extending through said housing and communicating with said first aperture; and a plurality of terminal members for receipt in predetermined ones of said second apertures in snap-in fashion, each of said terminal members including a reversely bent, longitudinally slotted, resilient contact strip extending from said second aperture into said first aperture, so that upon the insertion of said printed circuit board into said first aperture, said respective contact strips engage a corresponding conductor thereby to complete an electrical connection between said conductor and said terminal member, said housing including a base wall, the inside surface of said base wall comprising the floor of said first and second apertures, and wherein each of said terminal members includes a pair of side portions extending outwardly therefrom on opposite sides of said contact strip so as to prevent foreign objects from becoming entangled with said strip, said side portions of said terminal members resting on said floor upon the insertion of said terminal member into respective ones of said second apertures, each of said separate apertures including, extending inwardly thereinto from opposite sides thereof, a pair of ledge portions, and wherein said side portions of each of said terminal members are L-shaped with the longer leg of the L extending along the side thereof, so that upon the insertion of said terminal members into respective predetermined apertures, the longer legs of said side portions are supported by said ledge portions.

4. A printed circuit board connector comprising: a housing portion having a first aperture means therein for receiving a printed circuit board having a plurality of printed conductors thereon, and a plurality of second aligned aperture means extending therethrough, each of said plurality of second aperture means communicating with said first aperture means, and a plurality of terminal members received in certain predetermined ones of said second aperture means, each of said terminal members including a leading and trailing end portion, said leading end portion including resilient contact means for electrically connecting to said printed circuit board and said trailing end including means for connecting said terminal member to external circuitry, said terminal member further including snap-in means which, upon the insertion of the leading end portion of said terminal member into one of said second aperture means, secures said terminal member in said last mentioned aperture means, said leading end portion including a body extending forwardly from said trailing end portion, a finger integral with the front end of said body and extending rearwardly to a free rear end and displaced outwardly from said body and leaving a space between said body and said finger free rear end, and projection means on at least one side of said body extending substantially straight out from said body past and closely overlapping the free rear end of the finger.

5. A connector as set forth in claim 4 wherein the projection means comprises a pair of projection means on opposite sides of said body both extending past said finger rear end.

References Cited

UNITED STATES PATENTS

| | | | |
|---|---|---|---|
| 2,911,612 | 11/1959 | Jackson et al. | 339—217X |
| 3,015,083 | 12/1961 | Juris | 339—217X |
| 3,273,109 | 9/1966 | Moulin | 339—217 |
| 2,908,775 | 10/1959 | Gilbert | 339—17 |
| 3,209,310 | 9/1965 | Schwartz et al. | 339—258X |
| 3,283,291 | 11/1966 | Krol et al. | 339—276 |

FOREIGN PATENTS

| | | | |
|---|---|---|---|
| 1,246,341 | 10/1960 | France | 339—17 |
| 1,159,064 | 12/1963 | Germany | 339—217 |

RICHARD E. MOORE, Primary Examiner

U.S. Cl. X.R.

339—217